(12) United States Patent
Zhao et al.

(10) Patent No.: US 6,239,499 B1
(45) Date of Patent: May 29, 2001

(54) CONSISTENT ALIGNMENT MARK PROFILES ON SEMICONDUCTOR WAFERS USING PVD SHADOWING

(75) Inventors: Joe W. Zhao; Shumay X. Dou, both of San Jose; Wilbur Catabay, Saratoga, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/198,208

(22) Filed: Nov. 23, 1998

Related U.S. Application Data

(62) Division of application No. 08/924,902, filed on Sep. 8, 1997, now Pat. No. 5,926,720.

(51) Int. Cl.$^7$ ............................................. H01L 23/544
(52) U.S. Cl. ......................................... 257/797; 257/620
(58) Field of Search ................................ 257/797, 620; 438/401, 462

(56) References Cited

U.S. PATENT DOCUMENTS

| | | | |
|---|---|---|---|
| 5,002,902 | 3/1991 | Watanabe | 438/401 |
| 5,270,255 | 12/1993 | Wong | 438/643 |
| 5,532,520 | 7/1996 | Haraguchi et al. | 257/797 |
| 5,554,561 | 9/1996 | Plumton | 438/193 |
| 5,686,761 | 11/1997 | Huang et al. | 257/753 |
| 5,700,383 | 12/1997 | Feller et al. | 438/645 |
| 5,701,013 | 12/1997 | Hsia et al. | 250/491.1 |
| 5,702,981 | 12/1997 | Maniar et al. | 438/627 |
| 5,705,080 | 1/1998 | Leung et al. | 438/680 |
| 5,705,320 | * 1/1998 | Hsu et al. | 438/712 |
| 5,805,421 | * 2/1999 | Livengood et al. | 361/736 |
| 5,872,042 | * 2/1999 | Hsu et al. | 438/401 |

OTHER PUBLICATIONS

Wolf, et al. "Silicon Processing for the VLSI Era vol. 1–Process Technology," *Lattice Press*, p. 198 (1986).

* cited by examiner

*Primary Examiner*—Olik Chaudhuri
*Assistant Examiner*—Phat X. Cao
(74) *Attorney, Agent, or Firm*—Beyer Weaver & Thomas

(57) ABSTRACT

Provided is a method and composition for obtaining consistent alignment mark profiles with both detectibiliy and detection accuracy for use in conjunction with CMP planarization processes in semiconductor fabrication. The method involves physical vapor deposition of metal over an angled, metal-lined alignment mark trench in the surface of a semiconductor wafer following wafer planarization by CMP. The shape of the trench creates a shadowing effect which produces minimal deposition in the angled region of the trench and overcomes asymmetric metal loss due to attack from slurry accumulating in the trench during CMP. The result is the formation of a reliable and reproducible alignment mark.

15 Claims, 7 Drawing Sheets

CONSISTENT ALIGNMENT MARK PROFILES ON SEMICONDUCTOR WAFERS USING PVD SHADOWING

This is a Divisional application of copending prior Application Ser. No. 08/924,902 filed on Sep. 8, 1997, U.S. Pat. No. 5,926,720 designated the United States, the disclosure of which is incorporated herein by reference.

BACKGROUND OF THE INVENTION

The present invention relates to the formation of alignment marks for photolithographic masks in semiconductor wafer fabrication. More particularly, the present invention relates to alignment marks formed by physical vapor deposition shadowing during deposition of tungsten in alignment mark mold trenches of certain shapes.

Semiconductor wafer fabrication involves a series of processes used to create semiconductor devices and integrated circuits (ICs) in and on a semiconductor wafer surface. Fabrication typically involves the basic operations of layering and patterning, together with others such as doping, and heat treatments. Layering is an operation used to add thin layers of material (typically insulator, semiconductor or conductor) to the surface of the semiconductor wafer. Layers are typically either grown (for example, thermal oxidation of silicon to grow a silicon dioxide dielectric layer) or deposited by a variety of techniques such as chemical vapor deposition (CVD) and physical vapor deposition (PVD), including evaporation and sputtering. Patterning, is an operation that is used to remove specific portions of the top layer or layers on the wafer surface. Patterning is usually accomplished through the use of photolithography (also known as photomasking) to transfer the semiconductor design to the wafer surface.

The objective of the photolithographic process is to create in or on the wafer surface the various parts of a device or circuit in the exact dimensions specified by the circuit design ("resolution"), and to locate them in their proper location on the wafer surface ("alignment"). In order for the finished circuit to function properly, the entire circuit pattern circuit must be correctly placed on the wafer surface, and the individual parts of the circuit must be in the correct positions relative to each other. Since the final wafer pattern is generated from several photomasks applied to the wafer sequentially, misalignment of even a single mask layer can cause the entire circuit to fail.

In order to provide proper alignment of mask layers, photolithography tools are equipped to locate certain alignment marks on preceding layers. The alignment of two features on successive layers is straight forward. However, when, as is frequently the case, two features on non-successive layers require alignment, the location of the alignment marks through an intervening layer is more complicated. In many instances during fabrication, the preceding layer is transparent or translucent, allowing alignment marks on an underlying wafer to be optically detected by techniques well known in the art, such as bright field or dark field alignment. For example, a metal layer is typically covered by an oxide dielectric layer. A photolithography stepper using bright field alignment will be able to locate the metal lines in the metal layer, to which contact holes must be aligned, through the transparent oxide layer. The stepper may then properly align the mask for the via holes.

However, in some cases alignment of non-successive layers in which the intervening layer is opaque is required. This is the case with metal layer alignment, where it may be necessary to align a mask to a mark on a layer that is covered with an opaque metal layer. Alignment in such cases has been achieved by providing some topography in, for example, the underlying the metal layer. An example of this technique is illustrated in FIGS. 1A through 1D.

FIG. 1A shows a cross-section of a portion of a semiconductor wafer 101 during fabrication having a trench 100 etched in a surface layer 102 to provide a mold for an alignment mark. The alignment mark trench is typically adjacent to a die on the semiconductor wafer, and each die typically has several alignment marks associated with it. In a preferred embodiment, the surface layer 102 is a dielectric layer, such as an oxide, nitride, polymer, or composite of these, and will generally be referred to as such in this application.

The mark is typically formed by deposition of tungsten 104 by CVD in the mold trench 100. Conventional tungsten deposition is typically preceded by deposition of a thin layer of PVD or CVD titanium nitride (TiN) as a glue layer (not shown) for the subsequently deposited tungsten. The deposition typically has two phases. First a relatively thin nucleation layer 103 of tungsten with fine grain size and conformity having an equiaxed grain structure is deposited over the surface layer 102. This nucleation layer 103 provides a good base on the substrate material for subsequent bulk deposition of tungsten. The bulk tungsten 105, which is typically used to form the main body of the alignment mark due to its high deposition rate, has a columnar structure with uneven grain size and distribution and variable defect density relative to the nucleation layer 103. Since the CVD tungsten is conformal, a deposition trench 106, which follows the contours of the mold trench 100, remains in the surface of the wafer 108 following tungsten deposition. This deposition trench 106 ultimately serves as an alignment mark.

FIG. 1B shows the same wafer portion cross-section as in FIG. 1A following planarization of the wafer surface 108 according to an etch back technique well known in the art. The tungsten layer 104 above the level of the dielectric 102 has been removed, and the deposition trench 106 in the wafer surface is maintained by removal of tungsten in the mold trench 100 by the etch back. FIG. 1C shows the portion of the wafer 101 following deposition of a metal layer 110, typically AlCu, by PVD. PVD deposition is directional rather than conformal, however it does deposit the metal layer 110 in a predictable manner in the absence of obstructions so that the topographical pattern produced by the deposition trench 106 is reproducible.

As shown in FIG. 1D, metal deposition is followed by application of a conformal photoresist layer 112 which is subsequently patterned for the next layer (not shown). The result of this process is that the deposition trench 106 is maintained in a reproducible manner, providing a reliable alignment mark for the stepper when patterning the photoresist layer 112. The alignment mark is detectable, due to the topography it produces in the wafer surface, and provides detection accuracy, since the intervening process steps maintain the topography in a reproducible manner.

While the adoption of chemical mechanical polishing (CMP) of wafer surfaces during fabrication produced improved planarization results over etch back techniques, it has presented further problems for mask alignment. For example, as illustrated in FIG. 2A, a trench 200 is etched in a dielectric layer 202 at the surface of a wafer 204 to serve as a mold for an alignment mark. A tungsten layer 206 is conformally deposited over the wafer surface 208 by CVD. As described above, a conventional tungsten layer is composed of a thin nucleation layer 205 deposited over the dielectric 202, and bulk tungsten layer 207 over the nucleation layer 205. The CVD tungsten is conformal and forms a deposition trench 210 following the contours of the mold trench 200, with the bulk tungsten forming the walls 212 of the deposition trench.

As illustrated in FIG. 2B, as the wafer surface 208 is planarized by CMP, slurry (not shown) accumulates in the deposition trench 210. Since the polishing pad (not shown) does not contact the deposition trench walls 212 to polish them or remove the slurry, the walls 212 of the trench 210 are attacked by the oxidizing slurry. Due to the irregular structure of the bulk tungsten, discussed above, from which they are formed, the walls 212 are rendered uneven in an unpredictable way by the CMP slurry attack. As a result, the profile of the deposition trench 210 following CMP may be asymmetric and non-reproducible, as shown in FIG. 2B. This, in turn, results in an asymmetric and non-reproducible topography in the wafer surface 208 following metal deposition of the metal layer 214 and photoresist 216, illustrated in FIGS. 2C and 2D, respectively. Therefore, while the deposition trench alignment mark 210 may be detectable due to its topography, its detection accuracy is unreliable due to its unpredictable deformation by the CMP slurry.

Accordingly, what is needed are methods and compositions for obtaining consistent alignment mark profiles with both detectability and detection accuracy for use in conjunction with CMP processes during semiconductor fabrication.

SUMMARY OF THE INVENTION

To achieve the foregoing, the present invention provides a method and composition for obtaining consistent alignment mark profiles with both detectibiliy and detection accuracy for use in conjunction with CMP planarization processes in semiconductor fabrication. The method involves physical vapor deposition of metal over an angled, metal-lined alignment mark trench in the surface of a semiconductor wafer following wafer planarization by CMP. The shape of the trench creates a shadowing effect which produces minimal deposition in the angled region of the trench and overcomes asymmetric metal loss due to attack from slurry accumulating in the trench during CMP. The result is the formation of a reliable and reproducible alignment mark.

The present invention provides an alignment mark on a semiconductor wafer. The wafer includes an angled trench in a surface dielectric layer of the semiconductor wafer, a base layer of conformally deposited CVD metal lining the trench, and a PVD metal layer deposited on the base metal layer. The PVD metal layer incompletely fills an angled portion of the trench, and thereby provides an alignment mark for subsequent fabrication operations on said wafer. The trench is angled so as to provide a double shadowing effect at its angled portion. The trench is preferably angled at between about 120 and 90, more preferably at between about 100 and 90, and most preferably at about 90.

The invention also provides a method of forming an alignment mark on a semiconductor wafer. The method involves providing a semiconductor wafer having an angled trench in a surface dielectric layer, conformally depositing a base layer of a CVD metal over the wafer and in the trench, planarizing the wafer by chemical mechanical polishing, and depositing a layer of PVD metal over the base layer. The sidewalls forming an angle of the trench obstruct the PVD metal deposition according to a double shadowing effect such that a symmetric region of the trench remains unfilled by metal to provide an alignment mark for subsequent fabrication operations on the wafer. The method is capable of reproducibly generating an accurate and detectable alignment mark These and other features and advantages of the present invention are described below with reference to the drawings.

DETAILED DESCRIPTION OF THE PREFERRED EMBODIMENTS

The present invention provides a method and composition for obtaining consistent alignment mark profiles with both detectibiliy and detection accuracy for use in conjunction with CMP planarization processes in semiconductor fabrication. In a preferred embodiment, the method involves physical vapor deposition of metal over an angled, metal (preferably tungsten)-lined alignment mark trench in the surface of a semiconductor wafer following wafer planarization by CMP. The shape of the trench creates a shadowing effect which produces minimal deposition in the angled region of the trench and overcomes asymmetric metal loss due to attack from slurry accumulating in the trench during CMP. For example, a trench profile which includes angles, such as a chevron or triangular design, may produce the desired deposition effect. The result is the formation of a reliable and reproducible alignment mark.

In the following description, numerous specific details are set forth in order to fully illustrate preferred embodiments of the present invention. It will be apparent, however, that the present invention may be practiced without limitation to some specific details presented herein. For example, the shape of the alignment mark trench is not limited to those preferred embodiments illustrated and described, but may be any shape which produces the desired shadowing effect.

Moreover, the alignment marks of the present invention may be used in conjunction with planarization methods other than CMP. Also, the base metal deposited in the surface layer trench of the wafer to form the alignment mark may be a metal other than tungsten. For example, any metal which may be reliably deposited in a conformal manner may be used. Preferred metals will have a resistivity of no more than about 12 Ω-cm. Such metals, including aluminum and copper, will also typically be subject to CMP slurry attack.

Figure 1A:
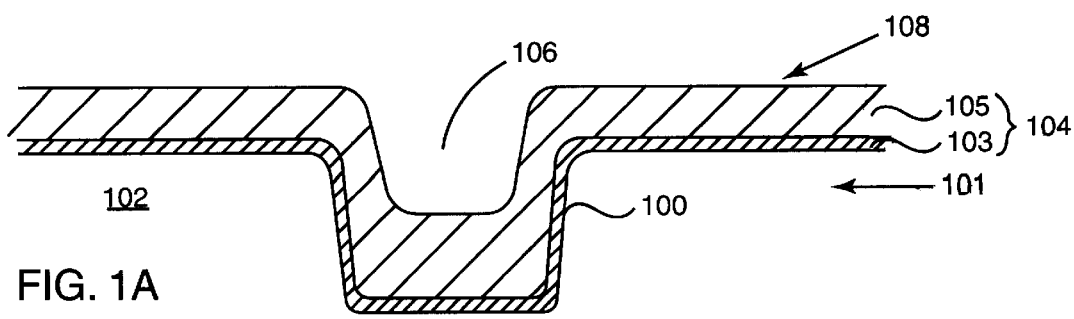
FIGS. 1A–D depict cross-sectional views of a portion of a semiconductor wafer showing various stages in the creation of a topographical alignment mark used with etch back planarization processing.
Figure 1B:
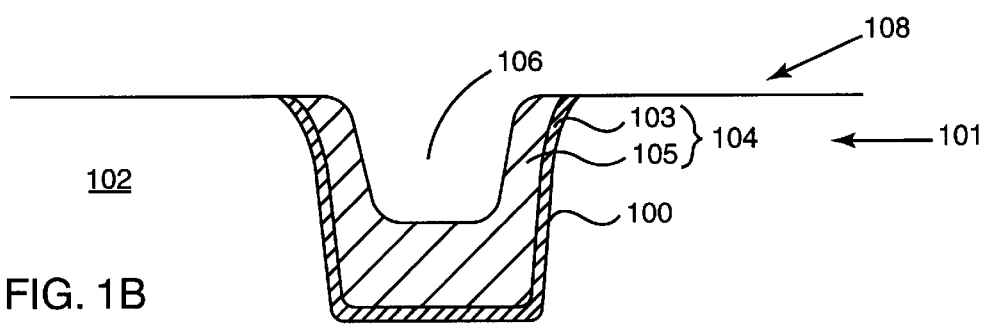
Figure 1C:
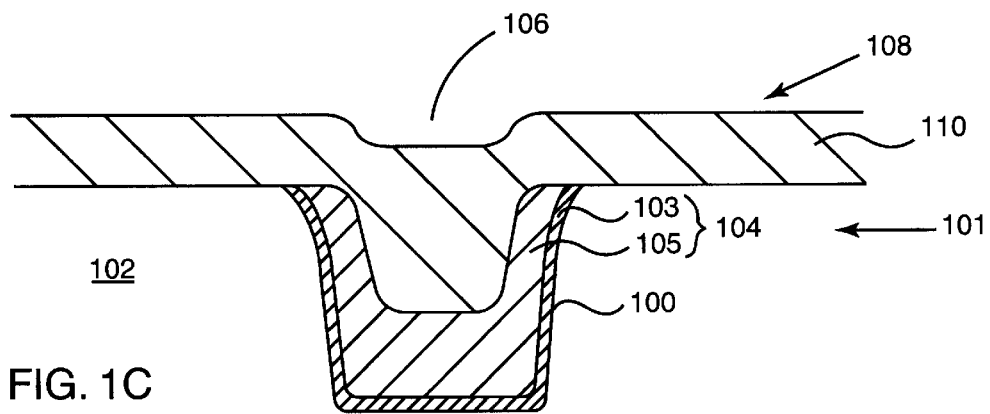
Figure 1D:
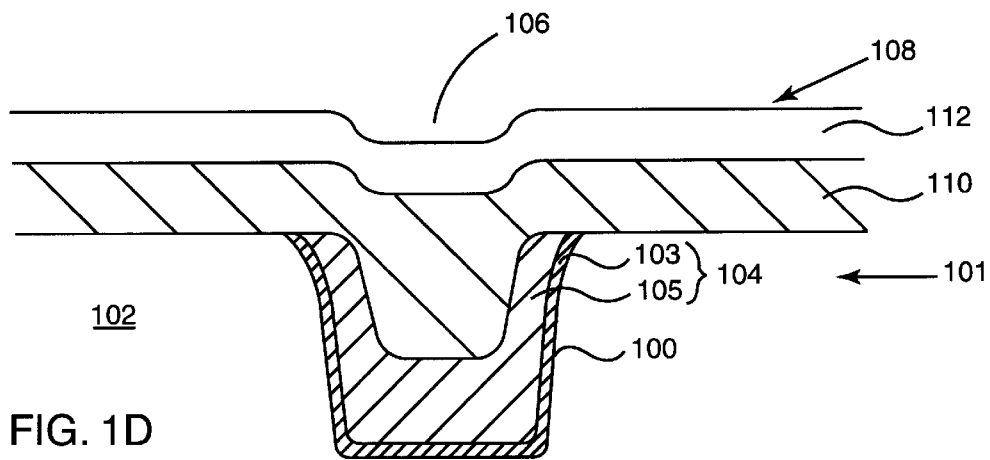
Figure 2A:
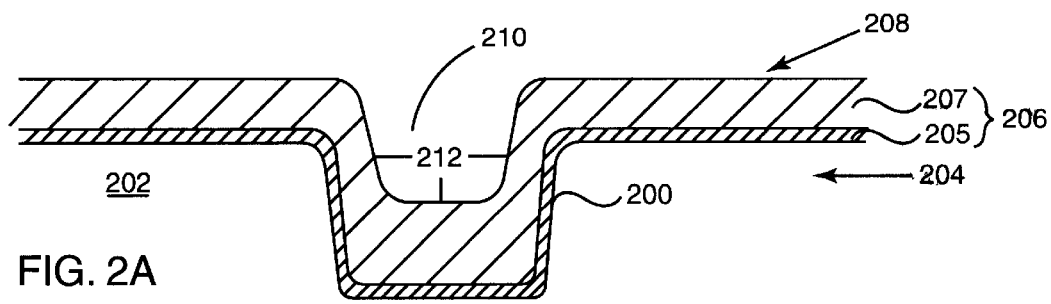
FIGS. 2A–D depict cross-sectional views of a portion of a semiconductor wafer showing various stages in the creation of a topographical alignment mark used with conventional CMP processing.
Figure 2B:
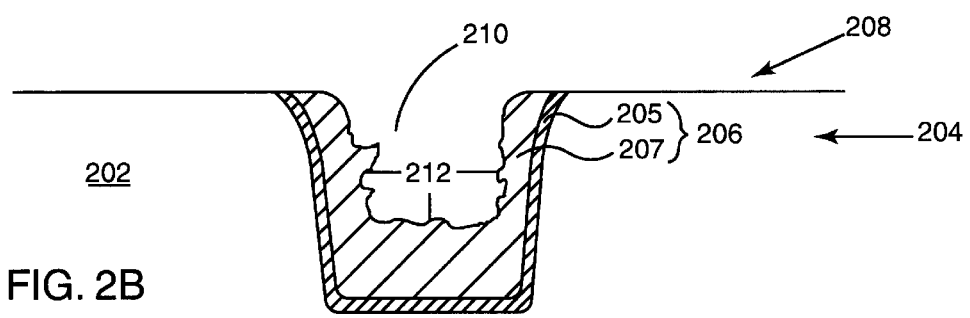
Figure 2C:
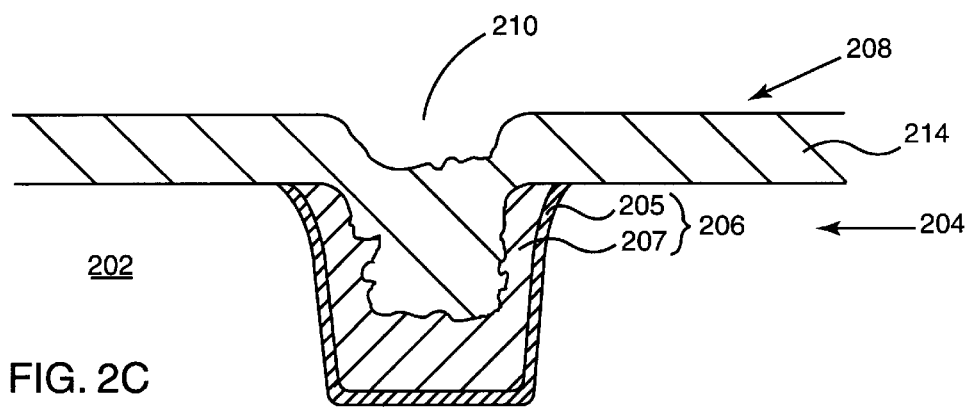
Figure 2D:
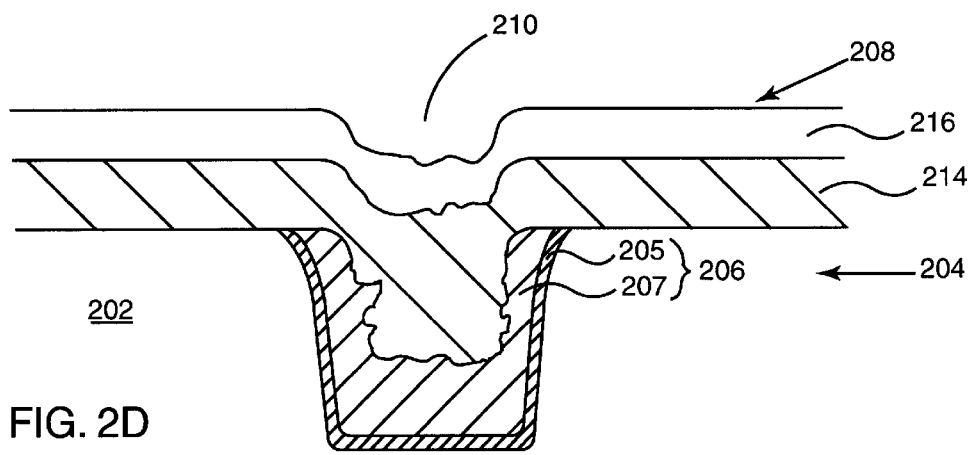
Figure 3A:
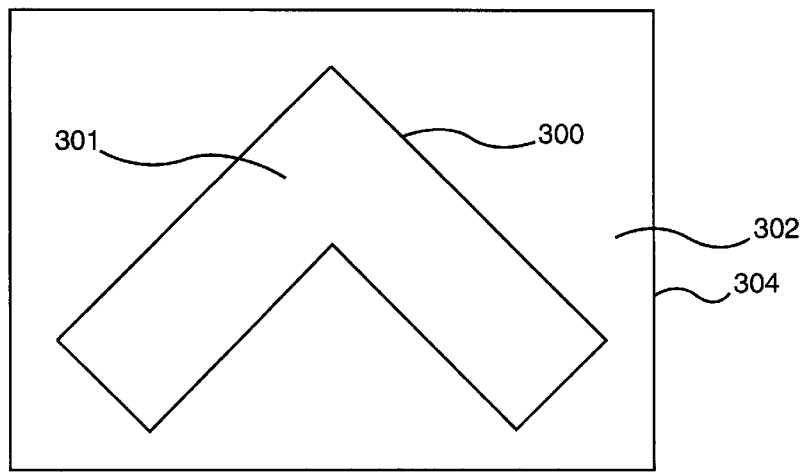
FIGS. 3A–C depict top plan views of a portion of a semiconductor wafer showing various stages in the creation of a topographical alignment mark for use with CMP processing, according to a preferred embodiment of the present invention.
Figure 3B:
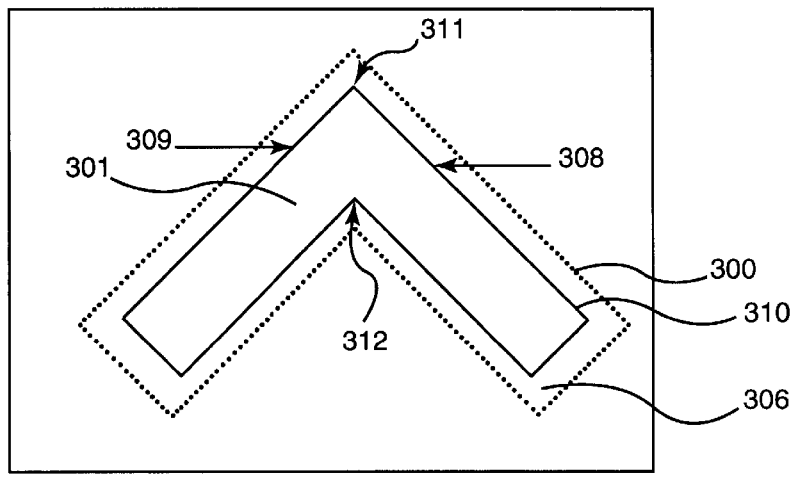
Figure 3C:
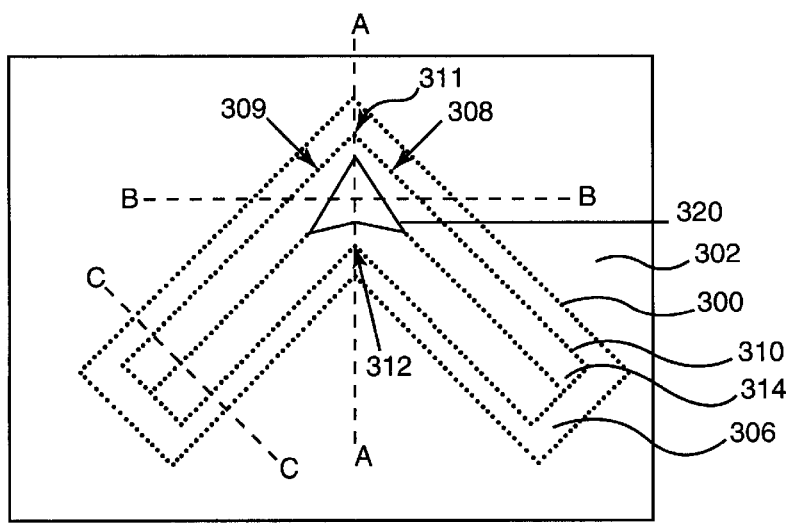

FIGS. 3A through 3C show top plan views of various stages in the in the creation of a topographical alignment mark compatible with CMP processing, according to a preferred embodiment of the present invention. As in the previous figures, in order to more clearly identify important features of the present invention, only a portion of the semiconductor wafer is shown. Also, the drawings are intended to be representative and are not necessarily to scale.

In FIG. 3A, a trench 300, having an angled portion 301, is provided, for example by plasma etch, in a dielectric layer 302 at the surface of a wafer 304, preferably adjacent to a die, to serve as a mold for an alignment mark. The dimensions of the trench 300 may vary depending on the scaling of the devices being fabricated. For typical dies on a typical 8 inch diameter wafer, the trench 300 is preferably between about 80 to 100 nm by 50 to 150 nm at its maximum extent, and has a width of about 1.5 to 3.0 $\mu$m most preferably about 2.0 $\mu$. The angled portion of the trench 300 should be angled to provide the desired shadowing effect, described below. Preferably, the trench 300 will have an angle of less than about 120, more preferably less than about 100, and most preferably about 90.

In a preferred embodiment, described below, the alignment mark is composed of tungsten. As noted above, other appropriate metals, for instance those which may be reliably deposited in a conformal manner may be used. Preferred metals will have a resistivity of no more than about 12 Ω-cm, for example, aluminum and copper.

As shown in FIG. 3B, a bulk tungsten layer 306 may be conformally deposited over the surface of the wafer 304, including the trench 300, by CVD. As described above, a conventional tungsten layer is typically composed of a thin nucleation layer (not shown), about 200 to 1000 Å thick deposited over the dielectric 302, and a bulk tungsten layer 306, about 2000 to 8000 Å thick deposited over the nucleation layer. A TiN glue layer also typically precedes the tungsten nucleation layer. As described above, the bulk tungsten layer 306 has a columnar structure with uneven grain size and distribution and variable defect density relative to the nucleation layer. In the figure, the remaining trench 310 is outlined in solid lines, while the original trench 300, now lined with CVD tungsten 306, is outlined in broken lines.

The bulk tungsten layer 306 may be deposited using conventional chemical vapor deposition parameters well known in the art, for example, a tungsten hexafluoride ($WF_6$) flow rate of preferably about 1 to 400 standard cubic centimeters per minute (sccm), more preferably about 50 to 100 sccm, and most preferably about 75 sccm; a hydrogen ($H_2$) flow rate of preferably about 2 to 2000 sccm, more preferably about 500 to 1000 sccm, and most preferably about 500 sccm; a pressure of preferably about 1 to 200 Torr, more preferably about 30 to 100 Torr, and most preferably about 40 to 90 Torr; and a temperature of preferably about 350 to 500 C, more preferably about 350 to 450 C, and most preferably about 400 C.

Following bulk tungsten deposition, the surface of the wafer 304 is planarized by CMP. As described above, slurry (not shown) which accumulates in the remaining deposition trench 310 attacks the bulk tungsten 306 trench walls in an uneven and unpredictable way characteristic of the structure of the bulk tungsten.

Then, as shown in FIG. 3C, a layer of metal 312, preferably aluminum (Al) or aluminum copper (AlCu), is deposited over the surface of the wafer 304, including the trench 310, by physical vapor deposition (PVD). The angled portion 301 of the trench 310 receives less PVD metal deposition because the PVD metal ions are directional and thus have difficulty reaching relatively constricted angled spaces. This phenomenon, known as "shadowing," has conventionally been viewed as a problem in PVD applications since it may result in the formation of undesirable deposition voids, or "keyholes." Therefore, angled trenches are typically avoided in conventional PVD applications. The present invention turns this conventionally disadvantageous characteristic of PVD into an advantage for the fabrication of alignment marks.

As shown in FIG. 3C, the PVD aluminum or AlCu 314 substantially fills most of the trench 310. However, the angled portion 301 of the trench 310 is subject to shadowing and is therefore not completely filled. Moreover, since deposition on each trench side wall forming the angle is shadowed by the other, a "double shadowing" effect is produced; that is, side wall 308 "shadows" (obstructs deposition on) side wall 309 to an increasing degree towards their intersection 311, and vice versa. A substantially symmetric shadowed area 320 capable of serving as an alignment mark results. This double shadowed PVD metal deposition is sufficient to overcome any asymmetry generated in the sidewalls of the trench 310 during CMP. Thus, an accurate and detectable alignment mark may be reproducibly created, even with CMP processing during fabrication.

Figure 4A:
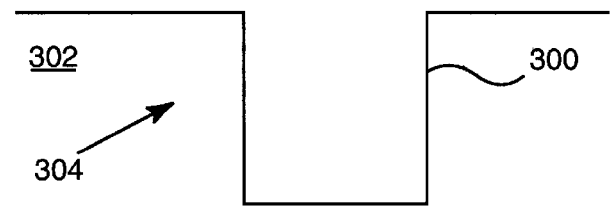
FIGS. 4A–C depict cross-sectional views through line A—A of the portion of the semiconductor wafer showing various stages in the creation of the topographical alignment mark shown in FIGS. 3A–C.
Figure 4B:
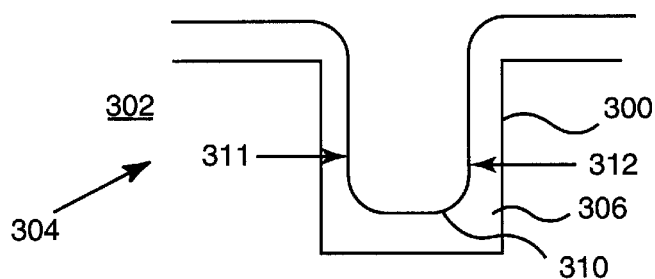
Figure 4B:
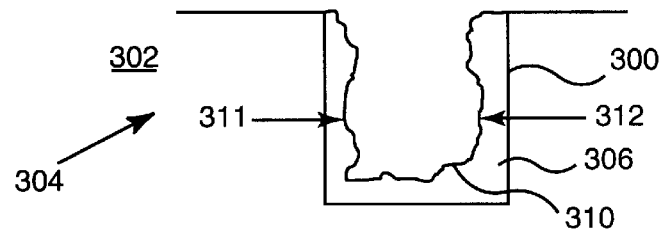
Figure 4C:
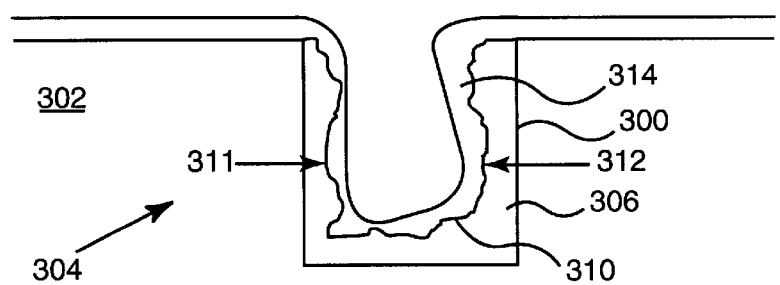

FIGS. 4A through 4C depict cross-sectional views through line A—A (shown on FIG. 3C) of the portion of the semiconductor wafer showing various stages in the creation of the topographical alignment mark shown in FIGS. 3A–C. FIG. 4A corresponds to FIG. 3A, and shows the alignment mark trench 300 formed in the surface dielectric layer 302, for example, by plasma etch. FIGS. 4B and 4B' correspond to FIG. 3B prior to, and following CMP, respectively. FIG. 4B shows the trench 300 lined with CVD tungsten 306. FIG. 4B' shows the wafer 304 following CMP with the asymmetric degradation of the remaining trench 310 walls by slurry which accumulated in the trench 310 during CMP.

FIG. 4C corresponds to FIG. 3C, and shows the effect of shadowing. Deposition of metal 314 is minimized at the intersection 311 of the sidewalls 308 and 309 forming the angle of the trench 310 where shadowing is maximized. At the opposite side 312 of the shadowed region 320, the shadowing effect is reduced as the sidewalls 308 and 309 diverge and are less of an obstruction to deposition on each other. As a result, deposition is heavier in this area 312.

Figure 5A:
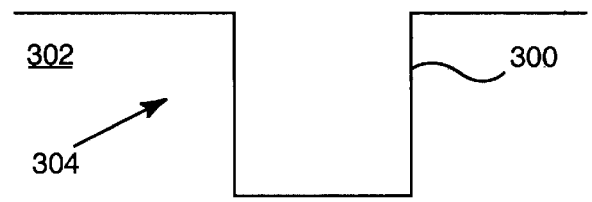
FIGS. 5A–C depict cross-sectional views through line B—B of the portion of the semiconductor wafer showing various stages in the creation of the topographical alignment mark shown in FIGS. 3A–C.
Figure 5B:
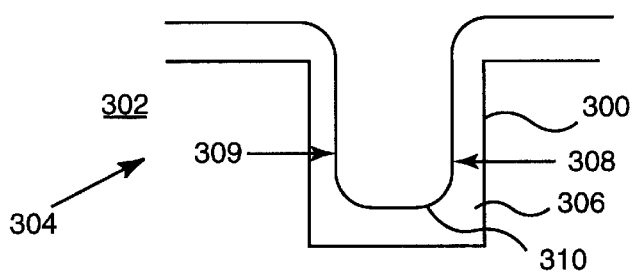
Figure 5B:
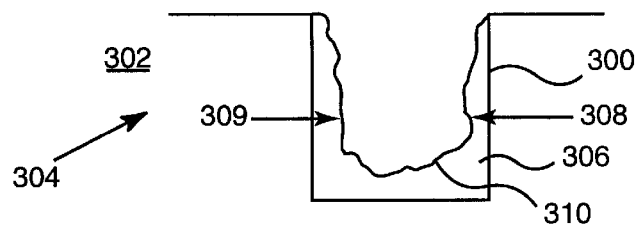
Figure 5C:
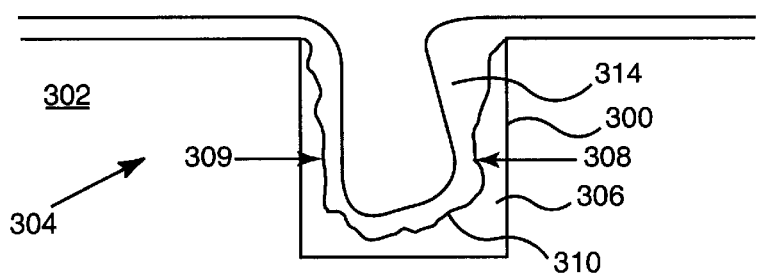

FIGS. 5A through 5C depict cross-sectional views through line B—B (shown on FIG. 3C) of the portion of the semiconductor wafer showing various stages in the creation of the topographical alignment mark shown in FIGS. 3A–C. FIG. 5A corresponds to FIG. 3A, and shows the alignment mark trench 300 formed in the surface dielectric layer 302, for example, by plasma etch. FIGS. 5B and 5B' correspond to FIG. 3B prior to, and following CMP, respectively. FIG. 5B shows the trench 300 lined with CVD tungsten 306. FIG. 5B' shows the wafer 304 following CMP with the asymmetric degradation of the remaining trench 310 walls by slurry which accumulated in the trench 310 during CMP.

FIG. 5C corresponds to FIG. 3C, and illustrates the symmetry-producing effect of double shadowing. Deposition of metal on the sidewalls 308 and 309 is reduced to the same extent by double shadowing, resulting in equal amounts of deposition and a substantially symmetric shadowed region 320. As noted above, any asymmetry generated during the CMP processing is overcome by the double shadowed PVD metal.

Figure 6A:
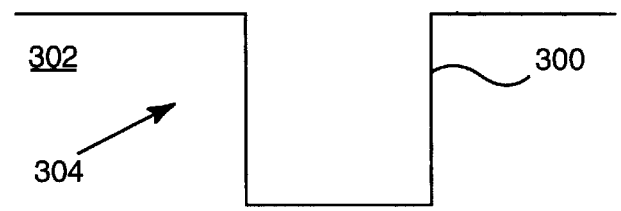
FIGS. 6A–C depict cross-sectional views through line C—C of the portion of the semiconductor wafer showing various stages in the creation of the topographical alignment mark shown in FIGS. 3A–C.
Figure 6B:
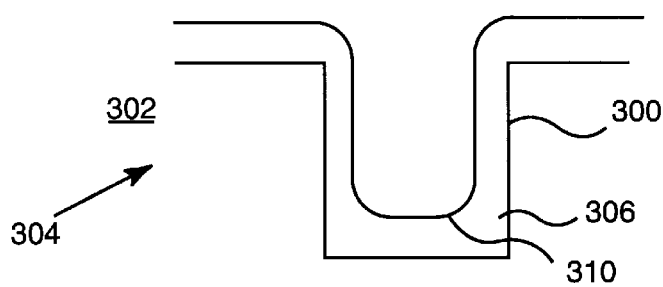
Figure 6B:
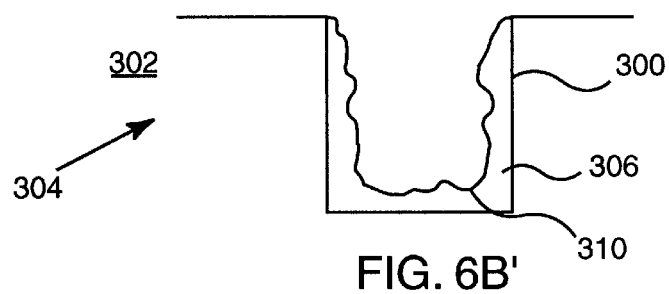

FIGS. 6A through 6D depict cross-sectional views through line C—C (shown on FIG. 3C) of the portion of the semiconductor wafer showing various stages in the creation of the topographical alignment mark shown in FIGS. 3A–C. FIG. 6A corresponds to FIG. 3A, and shows the alignment mark trench 300 formed in the surface dielectric layer 302, for example, by plasma etch. FIGS. 6B and 6B' correspond to FIG. 3B prior to, and following CMP, respectively. FIG. 6B shows the trench 300 lined with CVD tungsten 306. FIG. 6B' shows the wafer 304 following CMP with the asymmetric degradation of the remaining trench 310 walls by slurry which accumulated in the trench 310 during CMP.

Figure 6C:
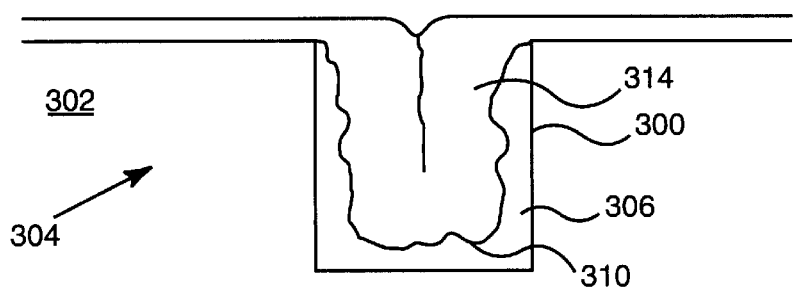

FIG. 6C corresponds to FIG. 3C, and illustrates the effect of PVD metal deposition in the absence of shadowing. Free of the obstruction created by the angled sidewalls 308 and 309, the metal deposits in the conventional manner, substantially filling the trench 310. Due to the resulting substantial elimination of topography, this portion of the trench does not form part of the alignment mark generated by the angled portion of the trench 301.

The substantially symmetric and reproducible topography of the shadowed area 320 following deposition of the metal layer 314 and photoresist (not shown) results in a reliable alignment mark which is detectable with accuracy for the patterning of the photoresist layer.

Figure 7:
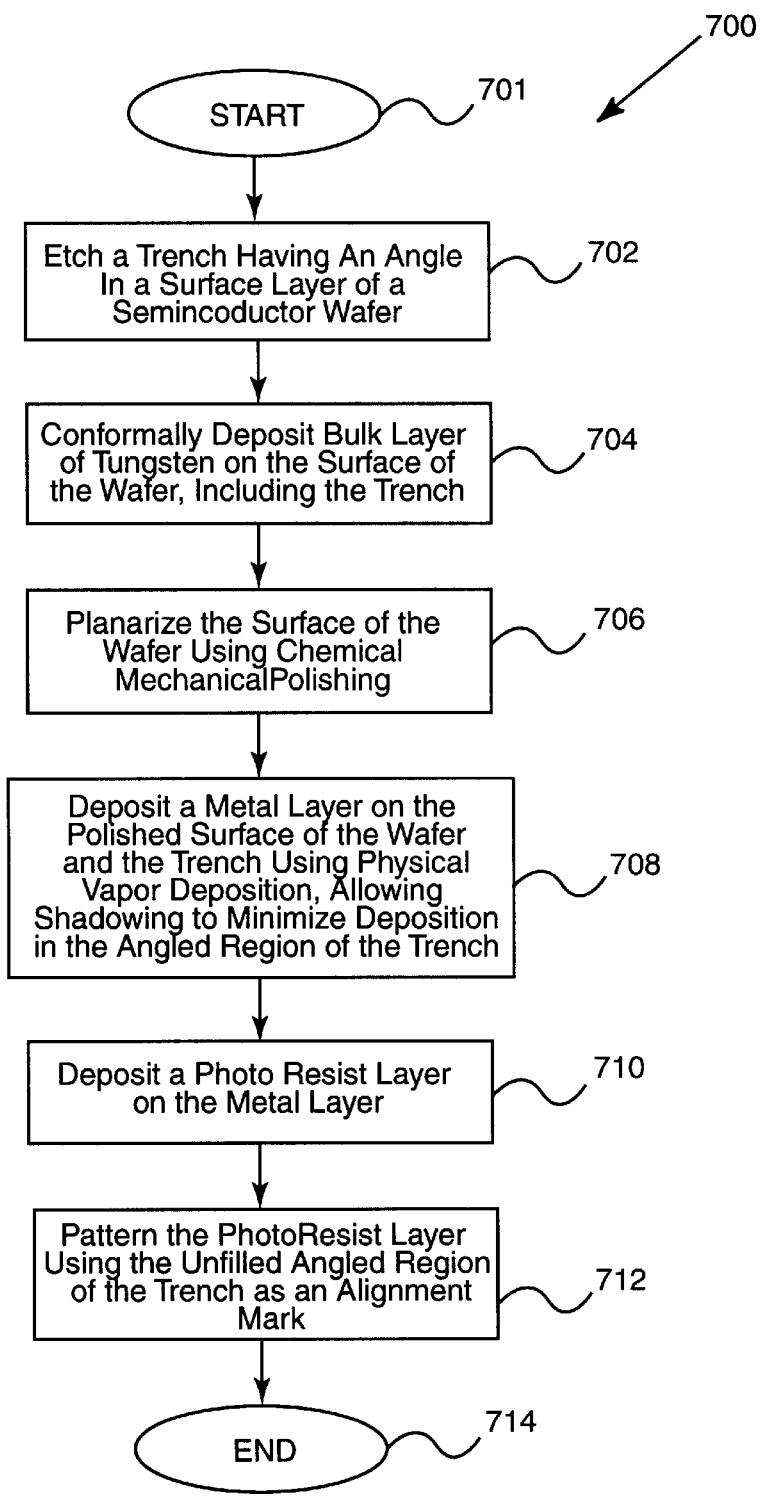
FIG. 7 depicts a flow chart showing the steps of a method of creating a topographical alignment mark for use with CMP processing, according to a preferred embodiment of the present invention.

FIG. 7 depicts a flow chart showing the steps of a method of creating a topographical alignment mark for use with CMP processing, according to a preferred embodiment of the present invention. The process flow 700 begins at 701, and in a step 702, a semiconductor wafer having an angled trench in a surface dielectric layer is provided. For example, the trench may be plasma etched in a surface dielectric layer on the wafer. As noted above, the trench may have a variety of shapes which are sufficient to generate the desired double shadowing effect. At a step 704, a layer of metal, for example bulk tungsten, is substantially conformally deposited on the surface of the wafer, including the trench. The remaining deposition trench substantially follows the contours of the original trench. Where tungsten is used as the base metal, the deposition of the bulk tungsten layer may be preceded by a nucleation layer of tungsten to provide a good base for the bulk layer.

At a step 706, the surface of the wafer is planarized using chemical mechanical polishing. The deposition trench sidewalls are deteriorated by CMP slurry accumulating in the deposition trench during CMP processing.

Then, a layer of metal, preferably Al or AlCu, is deposited over the polished surface of the wafer and the trench using physical vapor deposition at a step 708. Double shadowing caused by the mutual obstruction to directional PVD ion deposition presented by the intersecting sidewalls forming the angle of the trench symmetrically minimizes deposition in the angled region of the trench, leaving that area unfilled in a reproducible manner.

At a step 710, a layer of photoresist is deposited on the metal layer. When, at a step 712, the photoresist layer is patterned, the shadowed area serves as a reliable alignment mark. The process ends at 714.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope of the appended claims.

What is claimed is:

1. An alignment mark on a semiconductor wafer, comprising:

an angled trench in a dielectric surface layer of a semiconductor wafer;

a base layer of substantially conformally deposited CVD metal lining said trench; and a PVD metal layer deposited on said base layer, said PVD metal layer incompletely filling an angled portion of said trench, and thereby providing an alignment mark for subsequent fabrication operations on said wafer.

2. The alignment mark of claim 1 wherein said trench is between about 1.5 and 3.0 $\mu$ wide.

3. The alignment mark of claim 2 wherein said trench is about 2.0 $\mu$ wide.

4. The alignment mark of claim 1 wherein said trench is angled at between about 120 and 90 .

5. The alignment mark of claim 4 wherein said trench is angled at between about 100 and 90 .

6. The alignment mark of claim 5 wherein said trench is angled at about 90.

7. The alignment mark of claim 1 wherein said dielectric is an oxide.

8. The alignment mark of claim 1 wherein said CVD metal comprises tungsten.

9. The alignment mark of claim 11 wherein said tungsten has a columnar structure.

10. The alignment mark of claim 1 wherein said PVD metal comprises aluminum.

11. The alignment mark of claim 1 wherein said PVD metal comprises aluminum copper.

12. The alignment mark of claim 1 further comprising a photoresist layer deposited over said metal layer.

13. The alignment mark of claim 1 wherein said alignment mark is accurate and detectable.

14. The alignment mark of claim 13 wherein said alignment mark is reproducible.

15. An alignment mark on a semiconductor wafer, comprising:

means in the surface of a semiconductor wafer for producing a double shadow effect during physical vapor deposition of a metal over said wafer surface; and a PVD metal layer deposited over said means, said PVD metal layer providing an alignment mark for subsequent fabrication operations on said wafer.

* * * * *